(12) United States Patent
Lau et al.

(10) Patent No.: US 8,809,078 B1
(45) Date of Patent: Aug. 19, 2014

(54) SOLAR POWERED IC CHIP

(71) Applicants: Teck Beng Lau, Petaling Jaya (MY); Wai Yew Lo, Petaling Jaya (MY); Boon Yew Low, Petaling Jaya (MY); Chin Teck Siong, Shah Alam (MY)

(72) Inventors: Teck Beng Lau, Petaling Jaya (MY); Wai Yew Lo, Petaling Jaya (MY); Boon Yew Low, Petaling Jaya (MY); Chin Teck Siong, Shah Alam (MY)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/766,771

(22) Filed: Feb. 13, 2013

(51) Int. Cl.
*H01L 21/00* (2006.01)
*H01L 31/18* (2006.01)
*H01L 27/142* (2014.01)

(52) U.S. Cl.
CPC ............. *H01L 27/142* (2013.01); *H01L 31/18* (2013.01)
USPC .......... 438/19; 257/434; 257/E25.004; 438/67

(58) Field of Classification Search
CPC ...... H01L 31/0203; H01L 31/04; H01L 31/02
USPC .......... 257/434, E25.028, 448, 447, E25.004, 257/E25.007; 438/19, 66, 67
See application file for complete search history.

(56) References Cited

U.S. PATENT DOCUMENTS

| 4,970,453 | A | 11/1990 | Oogita |
| 5,150,193 | A | 9/1992 | Yasuhara |
| 6,476,474 | B1 | 11/2002 | Hung |
| 6,900,531 | B2 | 5/2005 | Foong |
| 7,605,476 | B2 | 10/2009 | Gritti |
| 2007/0087230 | A1 | 4/2007 | Jenson |
| 2007/0090387 | A1 * | 4/2007 | Daniels et al. .................. 257/99 |
| 2008/0121947 | A1 | 5/2008 | Frahm |
| 2009/0059159 | A1 * | 3/2009 | Howell et al. ................... 351/41 |
| 2010/0148293 | A1 * | 6/2010 | Jain et al. ....................... 257/434 |
| 2010/0234527 | A1 | 9/2010 | Ota |
| 2011/0012253 | A1 * | 1/2011 | Kwang et al. .................. 257/698 |
| 2011/0169554 | A1 | 7/2011 | Keysar |
| 2012/0025982 | A1 | 2/2012 | Mccain |
| 2012/0234922 | A1 | 9/2012 | Sample |
| 2013/0009851 | A1 * | 1/2013 | Danesh ........................ 343/904 |
| 2014/0073089 | A1 * | 3/2014 | Perng et al. .................... 438/107 |

FOREIGN PATENT DOCUMENTS

JP  11-026805  *  1/1999  .............. H01L 31/12

OTHER PUBLICATIONS

Takano et al (JP11-026805) Translation of Abstract (Jan. 1999), 1 page.*

* cited by examiner

*Primary Examiner* — Caridad Everhart
(74) *Attorney, Agent, or Firm* — Charles Bergere

(57) ABSTRACT

A self-powered circuit package includes a substrate and an integrated circuit (IC). The IC is mounted on a surface of the substrate. An electrical interconnector electrically couples the IC to the substrate. A solar cell is provided having opposing first and second main surfaces. A portion of the first main surface of the solar cell is configured to receive light from an external source. The solar cell converts energy of the received light into electrical power. The solar cell is disposed above the IC and electrically connected to the IC by way of the substrate to supply the generated power to the IC. A clear mold compound encapsulates a surface of the substrate, the IC, the electrical interconnector, and the solar cell.

17 Claims, 3 Drawing Sheets

SOLAR POWERED IC CHIP

BACKGROUND OF THE INVENTION

The present invention is directed to an integrated circuit package and a method of making integrated circuit packages that are self-powered through the use of an integral solar cell.

As wafer technology has advanced, the size and power requirements of integrated circuit (IC) chips have decreased. For example, ball grid array (BGA) packages are widely used in mobile devices because they are very small and have low power requirements. However, the power supplied to the IC chip conventionally comes from an external power source, such as a battery. Thus, placement of the IC chip must always be carefully considered so that the IC chip can be adequately accessed for coupling with the external power source. This makes the embedding of IC chips in items such as clothes, shoes, bicycles, the human body, or the like very difficult.

At the same time, the efficiency of solar cells has continued to improve. Specifically, in optimum conditions, the light-receiving surface area of a solar cell that is required to generate power has decreased. It has been found that a solar cell sized at about the same order of magnitude as an IC chip can be efficient enough to meet the power demand of such IC chip in low power environments.

It is therefore desirable to provide an IC chip package that has an integral a solar cell in order to reduce or eliminate the need for the IC chip to rely on an external power source.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

In the drawings.

DETAILED DESCRIPTION OF THE INVENTION

Figure 1:
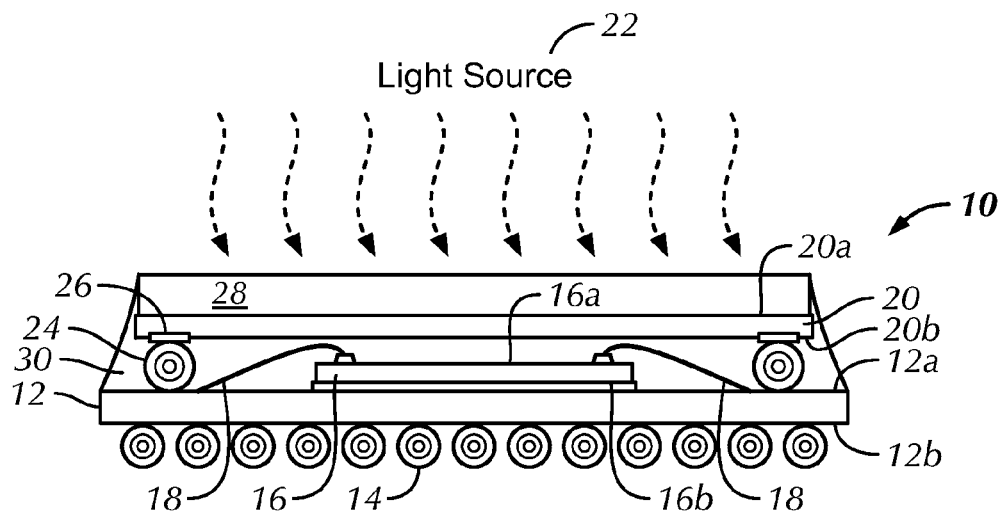
FIG. 1 is a cross-sectional side elevational view of an integrated circuit package in accordance with a first embodiment of the invention.

Referring to the drawings, wherein the same reference numerals are used to designate the same components throughout the several figures, there is shown in FIG. 1 a first embodiment of a self-powered integrated circuit package 10 in accordance with the invention. The self-powered package 10 includes a substrate 12 having opposing first and second main surfaces 12a, 12b. The substrate 12 is preferably formed of polymer-based materials, such as fiberglass, polyimide, or the like, although other types of materials may be used as well. A plurality of electrical conductors (not shown), in the form of copper traces or the like, are preferably formed on the first and/or second main surfaces 12a, 12b of the substrate 12. However, the electrical conductors may also be embedded or partially embedded in the substrate 12.

The substrate 12 may also be coated with a protective layer (not shown), such as a lacquer-like layer of polymer that can be used to provide a permanent protective coating for the electrical conductors.

It is preferred that the substrate 12 is of the BGA, tape BGA (TBGA), mold array process-BGA (MAPBGA), plastic BGA (PBGA) type, or the like. Accordingly, a plurality of solder balls 14 may be located on the second main surface 12b of the substrate 12 for providing a path for electrical signals between the package 10 and a printed circuit board (PCB) or other device (not shown) to which the package 10 is to be electrically coupled via the solder balls 14.

An IC chip 16 is mounted on the first main surface 12a of the substrate 12 opposite to the array of solder balls 14. The IC chip 16 is preferably formed of a semiconductor die made from any semiconductor material or combinations of materials, such as gallium arsenide, silicon germanium, silicon-on-insulator (SOI), silicon, monocrystalline silicon, the like, and combinations of the above. The IC chip 16 may comprise various types of circuits, as is known in the art, such as a System on a Chip (SOC), microprocessor or microcontroller, or a special purpose circuit (ASIC). Thus, the invention is not to be limited by the type of IC chip 16. The IC chip 16 includes a first main surface 16a and an opposing second main surface 16b. In the configuration shown in FIG. 1, the second main surface 16b of the IC chip 16 is attached to the first main surface 12a of the substrate 12. The attachment is preferably made by epoxy or a like adhesive, although other methods of attachment, such as solder mounts, welding, mechanical or other fasteners, or the like, may be used as well.

At least one, and preferably a plurality of electrical interconnectors 18 are provided to electrically couple the IC chip 16 to the electrical conductors on the first main surface 12a of the substrate 12. The electrical interconnectors 18 are preferably in the form of gold wires attached via a wire bonding process to the respective first main surfaces 12a, 16a of the substrate 12 and IC chip 16. Other similar conductive materials or technologies may be used for the wires.

However, other electrical interconnectors 18 may also be used, such as solder balls, conductive pads, through wafer vias, or the like, which would be present on the second main surface 16b of the IC chip 16, and would allow the physical mounting of the IC chip on the substrate 12 to also serve as the electrical connection.

A solar cell 20 is also provided as part of the package 10. The solar cell 20 preferably includes opposing first and second main surfaces 20a, 20b. At least a portion of the first main surface 20a of the solar cell 20 is configured to receive light emitted from an external light source 22, which can be, for example, the sun, an artificial lamp, or the like. As is conventionally known, the solar cell 20 is configured to convert energy of the received light into electrical power that is transferred, in this case, to the IC chip 16 either directly or via the substrate 12. The solar cell 20 is arranged such that the second main surface 20b of the solar cell 20 is in facing arrangement with the first main surface 16a of the IC chip 16.

The solar cell 20 may be conventional, and is formed of monocrystalline, polycrystalline, or amorphous silicon, or another like semiconductor material or combination thereof appropriately doped for efficient light absorption and subsequent separation and conduction of charge carriers. The solar cell 20 may also include surface conductive traces, anti-reflection coatings, metal contact pads, and other features as are conventionally known.

In the first embodiment shown in FIG. 1, the solar cell 20 is mounted to the first main surface 12a of the substrate 12 with solder balls 24 disposed on the second main surface 20b of the solar cell 20. The solder balls 24 are connected to solder pads 26 on the second main surface 20b of the solar cell 20 (i.e., "back"-side contacts) that form the electrical contacts for supplying the generated electrical power from the solar cell 20. Thus, in the first embodiment, the physical mounting and electrical connection of the solar cell 20 to the substrate 12 occur through the solder balls 24. Although not shown in FIG. 1, a spacer could be located between the first main surface 16a of the IC chip 16 and the second main surface of the solar cell 20b to prevent the solar cell 16 (or the substrate 12) from bending or warping such that the solar cell would contact and possibly damage the bond wires 18.

In the first embodiment shown in FIG. 1, at least the light receiving portion of the first main surface 20a of the solar cell 20 is laminated with an encapsulant 28 that is transparent (transmissive) to at least a wavelength of the received light. For example, the encapsulant 28 may be a clear polymer, such as ethylene-vinyl acetate (EVA) or the like. It is also preferred that the encapsulant 28 include laminated glass. The encapsulant 28 protects the first main surface 20a of the solar cell 20 from damage that might otherwise harm the light receiving portion of the solar cell 20. Although the encapsulant 28 is described as being laminated, other known techniques for applying a protective polymer or other suitable materials may be used, such as spun-on-glass (SOG), deposition, and the like.

The package 10 further includes a mold compound 30 that is disposed on the first main surface 12a of the substrate 12 and encapsulates the IC chip 16 and the electrical interconnectors 18, as is conventionally known. The mold compound 30 may be made from a ceramic material, a polymeric material, or the like. The mold compound 30 further encapsulates at least a portion of the solar cell 20 disposed on the substrate 12. In the first embodiment shown in FIG. 1, the first main surface 20a of the solar cell 20 is not encapsulated by the mold compound 30, and is therefore exposed therethrough. Since mold compounds 30 are often opaque to wavelengths of the light used by the solar cell 20 to generate power, this configuration allows the first main surface 20a of the solar cell 20 to have exposure to the light from the external source 22. With the presence of the encapsulant 28, the first main surface 20a of the solar cell 20 is protected, and does not require the mold compound 30 for this purpose.

Figure 2:
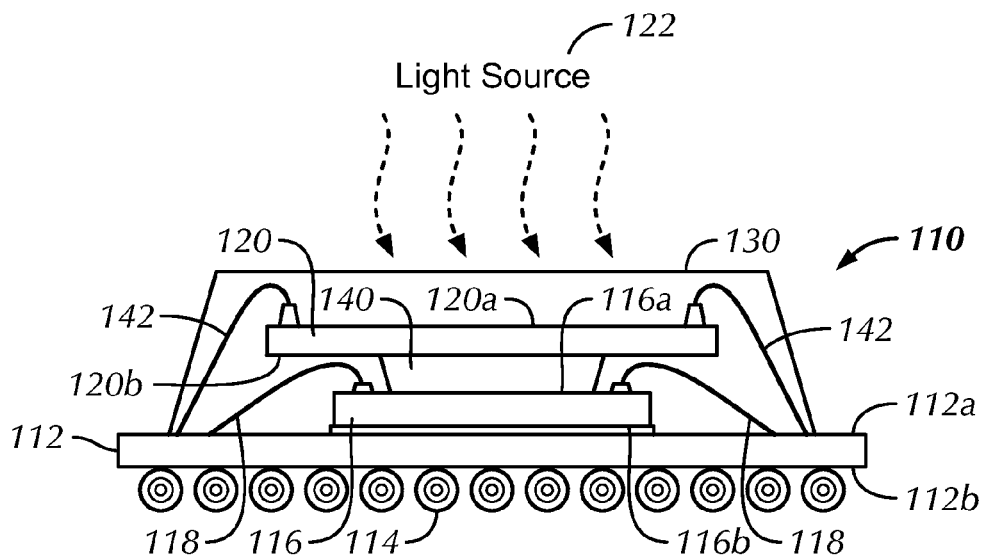
FIG. 2 is a cross-sectional side elevational view of an integrated circuit package in accordance with a second embodiment of the invention.

FIG. 2 shows a second embodiment of a package 110 in accordance with the invention. The second embodiment is similar to the first embodiment described above. Like numerals have been used for like elements, except the 100 series numerals have been used for the second embodiment. Accordingly, a complete description of the second embodiment has been omitted, with only the differences being described.

In the second embodiment, the solar cell 120 is physically mounted to the IC chip 116 rather than to the substrate 112. A spacer 140 is disposed between the second main surface 120b of the solar cell 120 and the first main surface 116a of the IC chip 116. The spacer 140 is preferably made of a non-conductive polymer or ceramic material, or the like. The spacer 140 is also preferably fixedly attached to the respective surfaces 120b, 116a with an epoxy or similar non-conductive adhesive or the like.

Electrical connection to the solar cell 120 is made using electrical interconnectors 142 coupled to the substrate 112 and the solar cell 120. Specifically in FIG. 2, the interconnectors 142 are in the form of power wires, which may be made from gold or other suitable conductive materials, connected to terminals (not shown) on the first main surface 120a of the solar cell 120 (i.e., "front"-side contacts) and corresponding electrical conductors (not shown) on the first main surface 112a of the substrate 112. Of course, the interconnectors 142 may be coupled to terminals on either main surface 120a, 120b, or other surface of the solar cell 120 in keeping with the concept of the invention.

In the second embodiment shown in FIG. 2, the mold compound 130 is preferably transparent or transmissive to at least the wavelength of light received by the solar cell 120 from the external source 122. Thus, the encapsulant 28 in the first embodiment is not required for the first main surface 120a of the solar cell 120 and the entire solar cell 120 may therefore be encapsulated within the mold compound 130 disposed on the first main surface 112a of the substrate 112.

Figure 3:
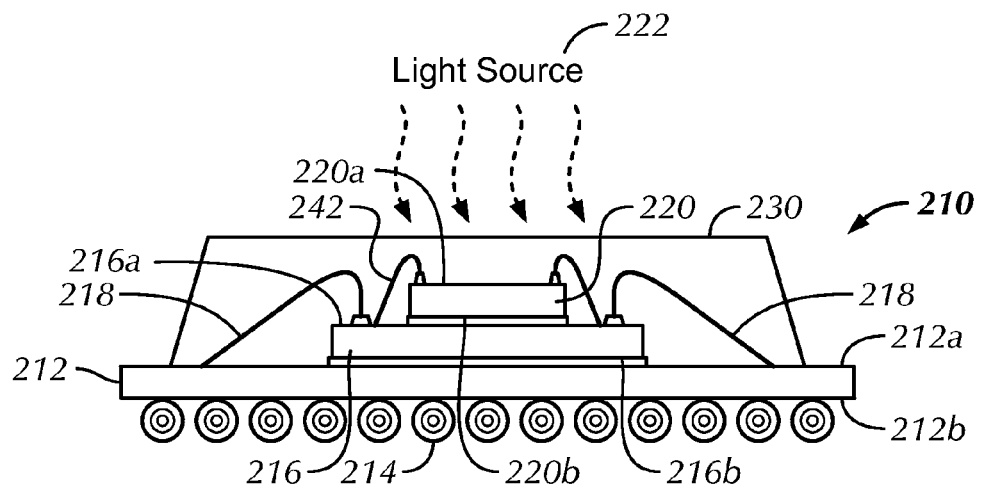
FIG. 3 is a cross-sectional side elevational view of an integrated circuit package in accordance with a third embodiment of the invention.

FIG. 3 shows a third embodiment of a package 210 in accordance with the invention. The third embodiment is similar to the second embodiment described above. Like numerals have been used for like elements, except the 200 series numerals have been used for the third embodiment. Accordingly, a complete description of the third embodiment has been omitted, with only the differences being described.

Much like the second embodiment, the solar cell 220 is physically mounted to the IC chip 216. However, in the embodiment shown in FIG. 3, the mount is direct between the second main surface 220b of the solar cell 220 and the first main surface 216a of the IC chip 216, with the aid of a non-conductive epoxy or a like adhesive interposed between the two surfaces 220b, 216a. This configuration is more akin to a typical "stacked" die structure and allows for a lower-profile package 210.

In addition, the electrical connection to the solar cell 220 is directly made by the IC chip 216 in the third embodiment. Specifically, the electrical interconnectors 242, in the case of FIG. 3 power wires, are coupled at one end to the first main surface 220a of the solar cell and at the other end directly to corresponding power terminals (not shown) on the first main surface 216a of the IC chip 216. As before, the terminal contacts for the solar cell 220 may be located on any convenient surface 220a, 220b.

In the third embodiment, the mold compound 230 is preferably the same as the mold compound 130 of the second embodiment.

As can be seen from the three exemplary embodiments shown in FIGS. 1-3, the surface area of the first main surface 20a, 120a, 220a of the solar cell 20, 120, 220 may be larger or smaller than the surface area of the first main surface 16a, 116a, 216a of the IC chip 16, 116, 216. The relative differences in surface area size are due to the functionality of the IC chip 16, 116, 216, the efficiency and light requirements of the solar cell 20, 120, 220, the power requirements of the IC chip 16, 116, 216, the technique used for mounting the solar cell 20, 120, 220, and other like considerations. It is preferred that the solar cell 20, 120, 220 have the size of a standard postage stamp.

With a package 10, 110, 210 according to embodiments of the present invention, the power requirements of the IC chip 16, 116, 216 can at least partially be met by the power output by the solar cell 20, 120, 220 contained within the package 10, 110, 210. Thus, the need for connection to an external power supply can be reduced, if not eliminated.

Figure 4:
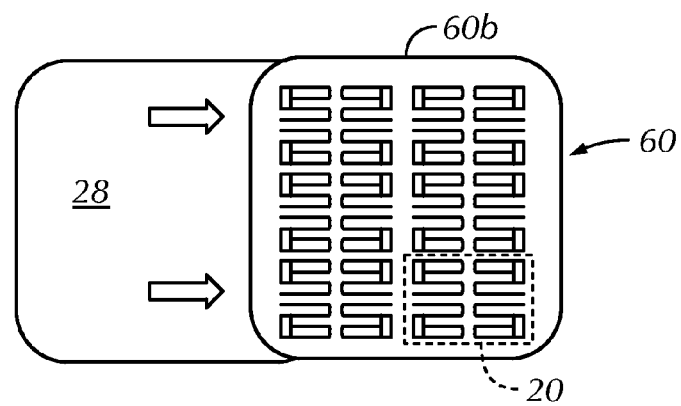
FIG. 4 is a bottom plan view of a solar cell wafer and encapsulant for lamination thereon.

Referring now to FIGS. 4-8, an exemplary method for manufacturing a package 10 in accordance with the first embodiment of the invention will now be described. In FIG. 4, a solar cell wafer 60 is provided having a plurality of individual solar cells 20 formed thereon. One or more sheets of the encapsulant 28 are preferably laminated to a first main surface (not shown) of the solar cell wafer 60.

Figure 5:
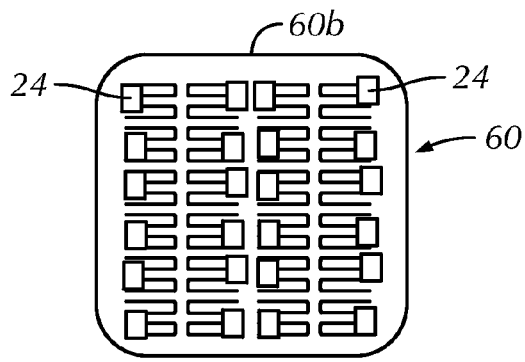
FIG. 5 is a bottom plan view of the wafer of FIG. 4 with solder balls attached thereto.

Solder pads (not shown) are located on the second main surface 60b of the solar cell wafer 60, and in FIG. 5, the solder balls 24 for each solar cell 20 are placed on respective pads, either automatically or manually. After a conventional reflow process, the solder balls 24 are properly bonded to the solar cells 20 and the solar cells 20 are ready for singulation.

Figure 6:
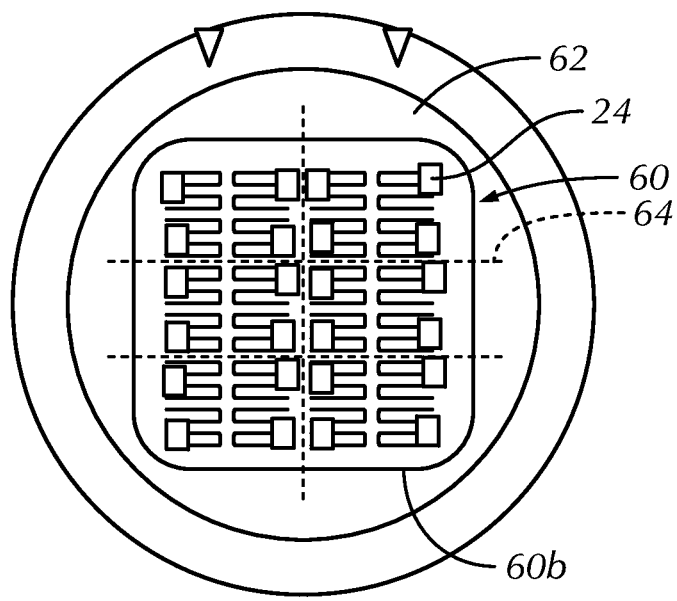
FIG. 6 is a bottom plan view of the wafer of FIG. 5 prior to separation of individual solar cells therefrom.

Referring to FIG. 6, the solar cell wafer 60 is preferably mounted onto conventional dicing tape 62 with the second main surface 60b of the wafer 60 facing outward. The individual solar cells 20 are then separated from the wafer 60 preferably using a saw (not shown) to sever the solar cells 20 along the dotted singulation lines 64. However, other methods of singulation, such as punch singulation or the like may be used as well. In the embodiment shown, the severed solar cells 20 each include four solder balls 24.

Figure 7:
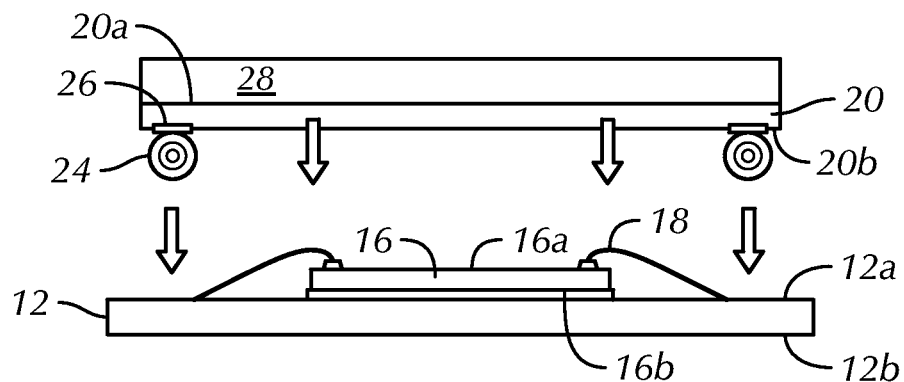
FIG. 7 is a cross-sectional side elevational view illustrating a step of attaching a solar cell to a substrate in accordance with an embodiment of the present invention.

Referring to FIG. 7, a singulated solar cell 20 is ready for mounting to the substrate 12 to which the IC chip 16 has been attached and electrically coupled by the electrical interconnectors 18. The attachment and coupling of the IC chip 16 to the substrate 12 may occur prior to, after, or simultaneously with formation of the solar cells 20. In this embodiment, the solder balls 24 of the solar cell 20 are placed onto corresponding solder pad openings (not shown) on the first main surface 12a of the substrate 12 and a conventional reflow process is performed. This makes the electrical connection of the solar cell 20 to the substrate 12, and hence the IC chip 16.

Figure 8:
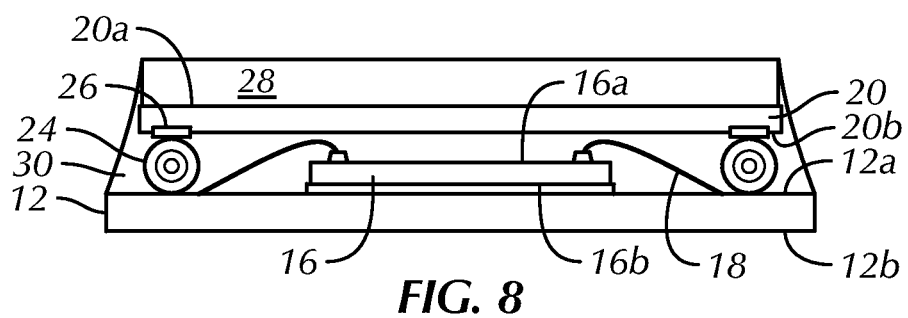
FIG. 8 is a cross-sectional side elevational view of the attached solar cell, IC chip, and substrate of FIG. 7 with a mold compound encapsulating portions thereof.

Referring to FIG. 8, the mold compound 30 is applied in a conventional manner and is molded to fill the volume between the IC chip 16 and solar cell 20, as well as fully encapsulate the IC chip 16, electrical interconnectors 16, and a portion of the solar cell 20. The molding is performed in this embodiment to leave the first main surface 20a of the solar cell 20, or at least the light receiving portion thereof, exposed upon completion. Once the mold compound 30 is set, the package 10 may be completed, as shown in FIG. 1, by attachment of the solder balls 14 to the second main surface of the substrate 12 using conventional techniques.

Clearly certain steps of the method may be altered and/or removed to form other embodiments of the package. For example, where the mold compound is transparent to the necessary wavelengths of light, the lamination step of the solar cell wafer can be omitted.

Similarly, the step of electrically connecting the solar cell may, rather than solder ball attachment and reflow processes, involve wire bonding to achieve the configurations shown in the embodiments in FIGS. 2 and 3. Thus, the solder ball attachment to the solar cells may be omitted.

Where the spacer 140 or epoxy attachments are utilized, as in FIGS. 2 and 3, these steps are applied prior to the application of the molding compound.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that boundaries between the above-described operations are merely illustrative. The multiple operations may be combined into a single operation, a single operation may be distributed in additional operations and operations may be executed at least partially overlapping in time. Further, alternative embodiments may include multiple instances of a particular operation, and the order of operations may be altered in various other embodiments.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A self-powered integrated circuit (IC) package, comprising:
   a substrate having opposing first and second main surfaces;
   an integrated circuit (IC) chip having opposing first and second main surfaces, the second main surface of the IC chip being mounted on the first main surface of the substrate;
   at least one first electrical interconnector that electrically couples the IC chip to the substrate;
   a solar cell having opposing first and second main surfaces, at least a portion of the first main surface of the solar cell being configured to receive light from an external source, the solar cell being configured to convert energy of the received light into electrical power;
   a plurality of second electrical interconnectors electrically coupling the solar cell to the first main surface of the substrate and thereby electrically connecting the solar cell to the IC chip via the substrate to supply the generated electrical power thereto, wherein the solar cell extends over the first main surface of the IC chip, and is mounted and electrically connected to the first main surface of the substrate with solder balls; and
   a mold compound disposed on the first main surface of the substrate and which encapsulates the IC chip, the at least one first electrical interconnector, and at least a portion of the solar cell.

2. The package of claim 1, wherein the mold compound is transparent or transmissive to at least a wavelength of the received light, and the first main surface of the solar cell is encapsulated by the mold compound.

3. The package of claim 1, further comprising a spacer located between the first main surface of the IC chip and the second main surface the solar cell, wherein the solar cell is mounted on the first main surface of the IC chip by way of the spacer.

4. The package of claim 1, wherein the second electrical interconnectors comprise bond wires.

5. The package of claim 1, wherein a surface area of the first main surface of the solar cell is larger than a surface area of the first main surface of the IC chip.

6. The package of claim 1, further comprising a plurality of solder balls mounted to the second main surface of the substrate.

7. The package of claim 1, further comprising an encapsulant laminated on at least the light receiving portion of the first main surface of the solar cell, wherein the encapsulant is transparent or transmissive to at least a wavelength of the received light.

8. The package of claim 7, wherein the laminated portion of the first main surface of the solar cell is also laminated with glass.

9. The package of claim 7, wherein at least the laminated portion of the first main surface of the solar cell is exposed through the mold compound.

10. The package of claim 1, wherein the IC chip is attached to the substrate with an adhesive.

11. The package of claim 10, wherein the at least one first electrical interconnector comprises a plurality of bond wires.

12. A self-powered integrated circuit (IC) package, comprising:
    a substrate having opposing first and second main surfaces;
    an integrated circuit (IC) chip having opposing first and second main surfaces, the second main surface of the IC chip being mounted on and electrically connected to the first main surface of the substrate;
    a solar cell having opposing first and second main surfaces, at least a portion of the first main surface of the solar cell being configured to receive light from an external source, wherein the solar cell converts energy of the received light into electrical power, wherein the second main surface of the solar cell is in facing arrangement with the first main surface of the IC chip;
    a first plurality of solder balls for attaching and electrically connecting the solar cell to the first main surface of the substrate and thereby electrically connecting the solar cell to the IC chip via the substrate to supply the generated electrical power thereto, wherein the solar cell extends over the first main surface of the IC chip; and
    a mold compound that encapsulates at least portions of the first main surface of the substrate, the IC chip and the solar cell.

13. The package of claim 12, wherein the mold compound is transparent or transmissive to at least a wavelength of the received light, and the first main surface of the solar cell is encapsulated by the mold compound.

14. The package of claim 12, further comprising a first plurality of bond wires electrically connecting the IC chip to the substrate.

15. The package of claim 14, further comprising a spacer located between the first main surface of the IC chip and the second main surface the solar cell, wherein the solar cell is mounted on the first main surface of the IC chip by way of the spacer.

16. A method of manufacturing a self-powered circuit package, the method comprising:
    mounting an integrated circuit (IC) chip having opposing first and second main surfaces on a first main surface of a substrate;
    electrically coupling, using at least one first electrical interconnector, the IC chip to the first main surface of the substrate;
    electrically connecting a solar cell having opposing first and second main surfaces to the first main surface of the substrate thereby electrically connecting the solar to the IC chip via the substrate, at least a portion of the first main surface of the solar cell being configured to receive light from an external source, the solar cell being configured to convert energy of the received light into electrical power that is supplied to the IC chip, and wherein the second main surface of the solar cell is in facing arrangement with the first main surface of the IC chip, wherein the solar cell extends over the first main surface of the IC chip, and is mounted and electrically connected to the first main surface of the substrate with solder balls; and
    encapsulating, in a mold compound, the IC chip, the at least one first electrical interconnector, at least a portion of the first main surface of the substrate, and at least a portion of the solar cell.

17. The method of claim 16, further comprising laminating at least the light receiving portion of the first main surface of the solar cell with an encapsulant that is transparent or transmissive to at least a wavelength of the received light.

* * * * *